(12) United States Patent
Hamano

(10) Patent No.: US 10,602,050 B2
(45) Date of Patent: Mar. 24, 2020

(54) IMAGE PICKUP APPARATUS AND CONTROL METHOD THEREFOR

(71) Applicant: CANON KABUSHIKI KAISHA, Tokyo (JP)

(72) Inventor: Hideyuki Hamano, Kawasaki (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 15/217,487

(22) Filed: Jul. 22, 2016

(65) Prior Publication Data

US 2017/0034425 A1    Feb. 2, 2017

(30) Foreign Application Priority Data

Jul. 29, 2015 (JP) .................................. 2015-149656

(51) Int. Cl.
*H04N 5/232* (2006.01)
*H04N 5/369* (2011.01)
(Continued)

(52) U.S. Cl.
CPC .......... *H04N 5/23212* (2013.01); *G02B 7/36* (2013.01); *H04N 5/23209* (2013.01); *H04N 5/369* (2013.01); *H04N 9/045* (2013.01)

(58) Field of Classification Search
CPC ............... H04N 5/23212; H04N 5/369; H04N 5/23209; H04N 9/045; G02B 7/36
See application file for complete search history.

(56) References Cited

U.S. PATENT DOCUMENTS

2010/0194967 A1* 8/2010 Amano ............. H04N 5/23212
                                                  348/345
2012/0057043 A1* 3/2012 Yamamoto ........... H04N 5/3696
                                                  348/222.1
(Continued)

FOREIGN PATENT DOCUMENTS

JP      2010-152161 A    7/2010
JP      2011-135191 A    7/2011
(Continued)

OTHER PUBLICATIONS

The above foreign patent document was cited in the Mar. 19, 2019 Japanese Office Action, which is enclosed without an English Translation, that issued in Japanese Patent Application No. 2015149656.

*Primary Examiner* — Jason A Flohre
(74) *Attorney, Agent, or Firm* — Cowan, Liebowitz & Latman, P.C.

(57) ABSTRACT

An image pickup apparatus, including: an image pickup element configured to photoelectrically convert an object image; a signal acquisition unit configured to acquire a first signal obtained from a light flux that has passed through a first pupil partial region, a second signal obtained from a light flux that has passed through a second pupil partial region, and a third signal obtained from one of a light flux that has passed through a region that includes the first pupil partial region and is wider than the first pupil partial region, and a light flux that has passed through a region that includes the second pupil partial region and is wider than the second pupil partial region; and a defocus state detection unit configured to detect a defocus state based on at least one of the first signal and the second signal, and the third signal.

18 Claims, 8 Drawing Sheets

(51) Int. Cl.
G02B 7/36 (2006.01)
H04N 9/04 (2006.01)

(56) References Cited

U.S. PATENT DOCUMENTS

| | | | | |
|---|---|---|---|---|
| 2012/0057062 | A1* | 3/2012 | Hamada | H04N 5/23212 348/333.02 |
| 2012/0293706 | A1* | 11/2012 | Usui | H04N 5/23212 348/345 |
| 2014/0146196 | A1* | 5/2014 | Shoda | H04N 5/23212 348/222.1 |
| 2015/0281555 | A1* | 10/2015 | Kishida | H04N 5/23212 348/346 |
| 2016/0353009 | A1* | 12/2016 | Aoki | H04N 5/23212 |

FOREIGN PATENT DOCUMENTS

| | | |
|---|---|---|
| JP | 2014-048459 A | 3/2014 |
| JP | 2014-063142 A | 4/2014 |

\* cited by examiner

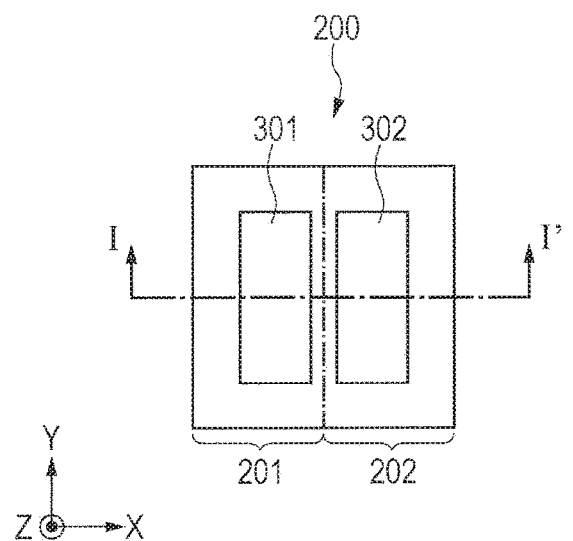
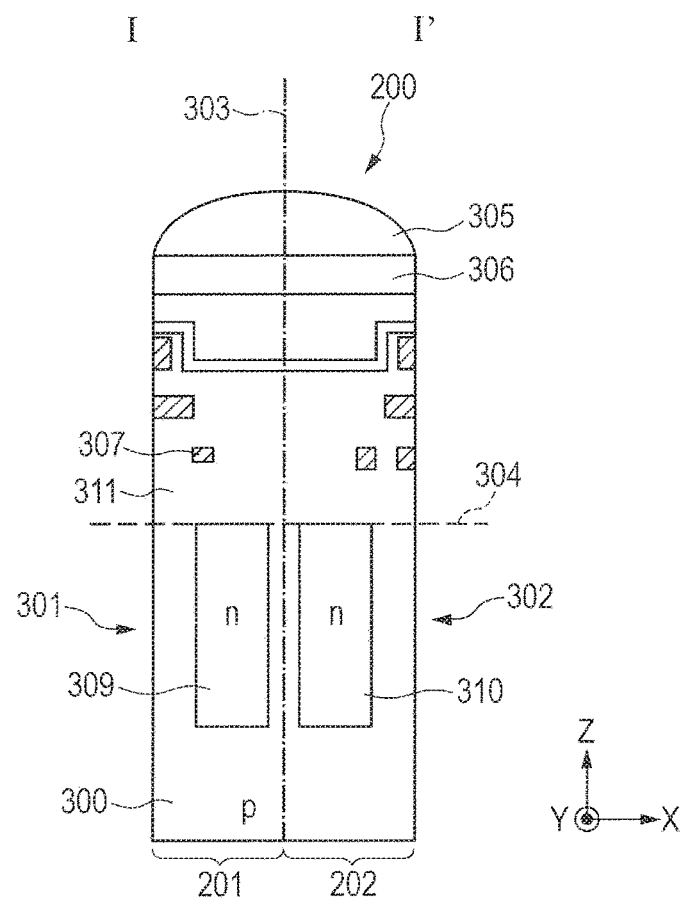

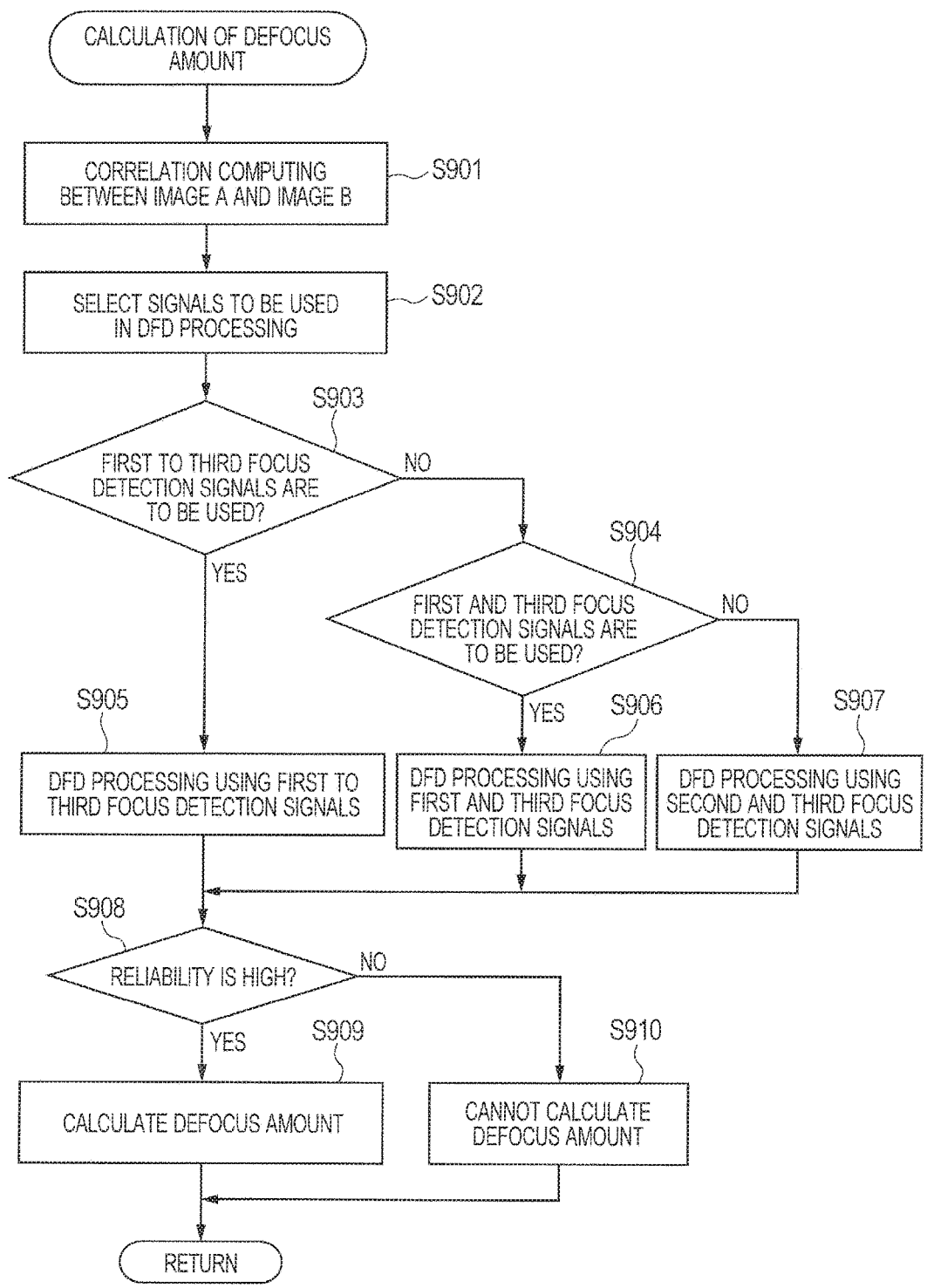

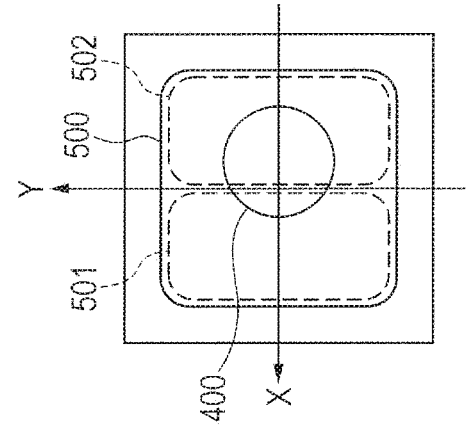
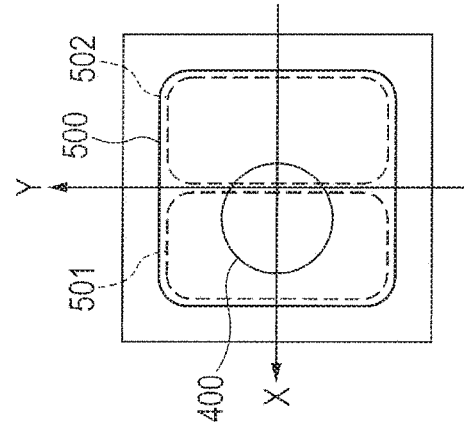
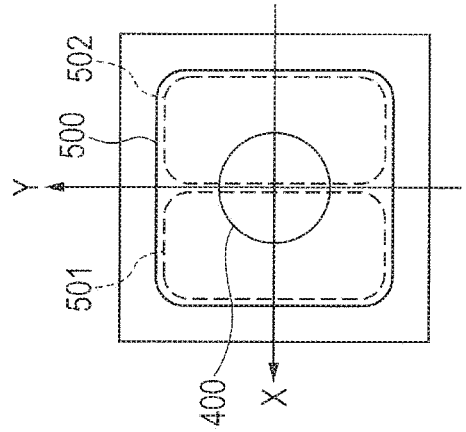
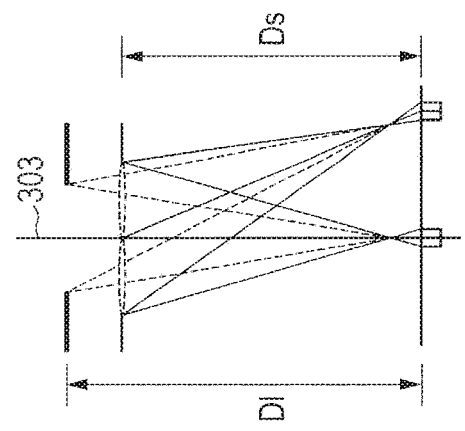
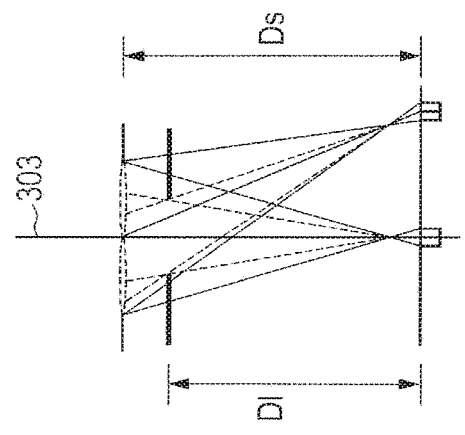
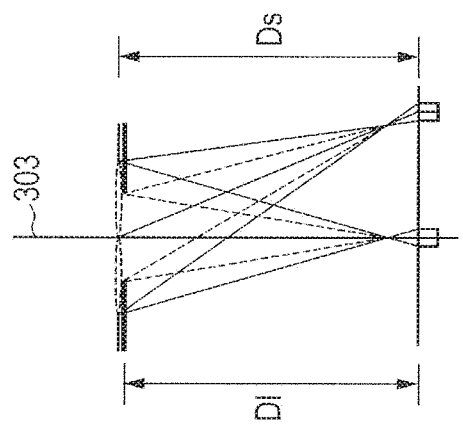
FIG. 10A  FIG. 10B  FIG. 10C

IMAGE PICKUP APPARATUS AND CONTROL METHOD THEREFOR

BACKGROUND OF THE INVENTION

Field of the Invention

The present disclosure relates to an image pickup apparatus and a control method therefor.

Description of the Related Art

In electronic devices having an image pickup function, such as a digital camera, a mobile phone equipped with a camera, a game machine, and a personal computer, an automatic focus detection (auto-focus) function is generally realized.

In Japanese Patent Application Laid-Open No. 2014-63142, there is described an image pickup element, in which one microlens and a photoelectric converter, which is divided into a plurality of photoelectric converters, are formed for one pixel. The divided photoelectric converters are configured to receive light beams that have passed through different regions or an exit pupil of a photographing lens through one microlens, to thereby perform pupil division. A correlation amount between a plurality of focus detection signals output from the pixel having the divided photoelectric converters, that is, a focus detection pixel, may be calculated, and an image shift amount may be calculated from the correlation amount, to thereby perform phase-difference focus detection. There is also described in Japanese Patent Application Laid-Open No. 2014-63142 that the focus detection signals output from the divided photoelectric converters are added for each pixel to generate an image pickup signal. There is further described in Japanese Patent Application Laid-Open No. 2014-63142, in addition to the phase-difference focus detection, a technology of performing depth-from-defocus (DFD) focus detection. Also in Japanese Patent Application Laid-Open No. 2014-48459, there is described a technology of performing the DFD focus detection.

However, in the related-art image pickup apparatus, there have been cases where focusing cannot always be performed satisfactorily.

SUMMARY OF THE INVENTION

According to one aspect of an embodiment, there is provided an image pickup apparatus, including: an image pickup element configured to photoelectrically convert an object image, which is generated by a photographing optical system; a signal acquisition unit configured to acquire, using the image pickup element, a first signal obtained from a light flux that has passed through a first pupil partial region, which is a part of a pupil region of the photographing optical system, a second signal obtained from a light flux that has passed through a second pupil partial region, which is different from the first pupil partial region, of the pupil region, and a third signal obtained from one of a light flux that has passed through a region that includes the first pupil partial region and is wider than the first pupil partial region, and a light flux that has passed through a region that includes the second pupil partial region and is wider than the second pupil partial region; and a defocus state detection unit configured to detect a defocus state of the photographing optical system based on at least one of the first signal and the second signal, and the third signal.

According to another aspect of an embodiment, there is provided a control method for an image pickup apparatus, including: acquiring, using an image pickup element configured to photoelectrically convert an object image, which is generated by a photographing optical system, a first signal obtained from a light flux that has passed through a first pupil partial region, which is a part of pupil region of the photographing optical system, a second signal obtained from a light flux that has passed through a second pupil partial region, which is different from the first pupil partial region, of the pupil region, and a third signal obtained from one of a light flux that has passed through a region that includes the first pupil partial region and is wider than the first pupil partial region, and a light flux that has passed through a region that includes the second pupil partial region and is wider than the second pupil partial region; selecting at least one of the first signal and the second signal; and detecting a defocus state of the photographing optical system based on the at least one of the first signal and the second signal, and the third signal.

According to further another aspect of an embodiment, there is provided a non-transitory computer-readable storage recording medium storing a program for causing a computer to execute: acquiring, using an image pickup element configured to photoelectrically convert an object image, which is generated by a photographing optical system, a first signal obtained from a light flux that has passed through a first pupil partial region, which is a part of a pupil region of the photographing optical system, a second signal obtained from a light flux that has passed through a second pupil partial region, which is different from the first pupil partial region, of the pupil region, and a third signal obtained from one of a light flux that has passed through a region that includes the first pupil partial region and is wider than the first pupil partial region, and a light flux that has passed through a region that includes the second pupil partial region and is wider than the second pupil partial region; selecting at least one of the first signal and the second signal; and detecting a defocus state of the photographing optical system based on the at least one of the first signal and the second signal, and the third signal.

Further features of the present invention will become apparent from the following description of exemplary embodiments with reference to the attached drawings.

BRIEF DESCRIPTION OF THE DRAWINGS

FIGS. 3A and 3B are respectively a plan view and a sectional view for illustrating a pixel portion of the image pickup element of the image pickup apparatus according to the one embodiment of the present invention.

FIG. 9 is a flow chart for illustrating defocus amount calculation processing in the image pickup apparatus according to the one embodiment of the present invention.

FIGS. 10A, 10B and 10C are schematic views for illustrating shading.

DESCRIPTION OF THE EMBODIMENTS

Preferred embodiments of the present invention will now be described in detail in accordance with the accompanying drawings.

One Embodiment

An image pickup apparatus according to one embodiment of the present invention, and a control method therefor are described with reference to the drawings.

Figure 1:
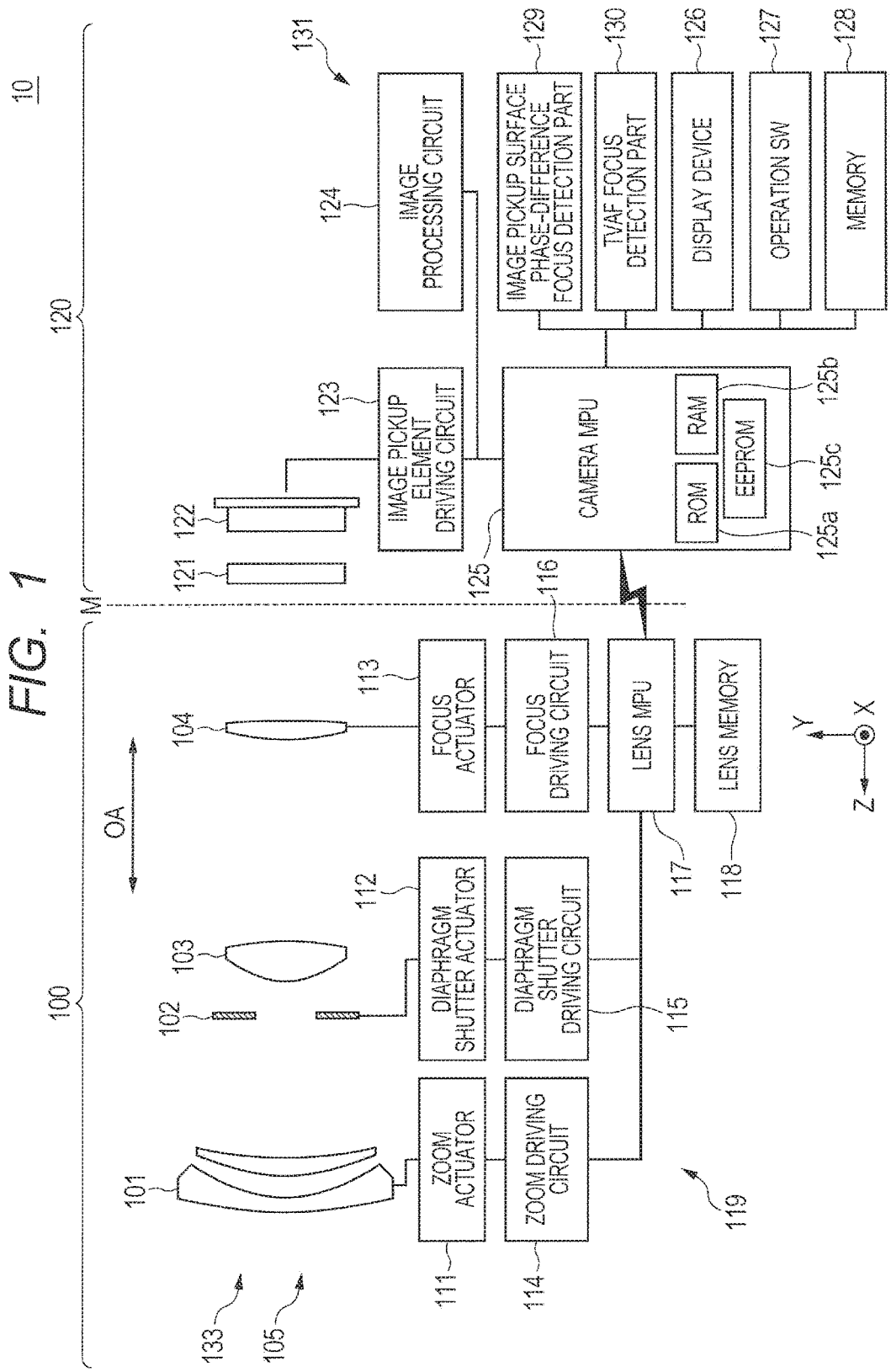
FIG. 1 is a block diagram for illustrating a schematic configuration of an image pickup apparatus according to one embodiment of the present invention.

First, a lens unit 100 used in an image pickup apparatus 10 according to this embodiment is described with reference to FIG. 1. FIG. 1 is a block diagram for illustrating a schematic configuration of the image pickup apparatus 10 according to this embodiment. Here, a case where the image pickup apparatus 10 is an interchangeable lens digital single-lens reflex camera is described as an example, but the present invention is not limited thereto.

To a main body (camera main body, body) 120 of the image pickup apparatus (camera) 10 according to this embodiment, a lens unit 100 is configured to be mounted. The lens unit 100 is mounted to the image pickup apparatus main body 120 via a mount M indicated by the dotted line at a center portion of FIG. 1.

The lens unit 100 includes a photographing lens 105 and a lens driving/controlling system 119. The photographing lens 105 is configured to form an optical image or an object, that is, an object image. The photographing lens 105 includes a first lens group 101, a diaphragm shutter 102, a second lens group 103, and a focus lens group (hereinafter referred to as "focus lens") 104. The first lens group 101, the diaphragm shutter 102, the second lens group 103, and the focus lens 104 construct a part of an optical system (imaging optical system, photographing optical system, image pickup optical system) 133 configured to form an optical image of an object on an image pickup surface (pixel array region) of an image pickup element 122.

The first lens group 101 is arranged at a leading end portion of the lens unit 100, and is held to be able to perform an advancing/retracting operation in an optical axis direction OA. The diaphragm shutter 102 has a function of adjusting a light amount during photographing, and is configured to also function as a mechanical shutter configured to control exposure time at the time of taking a still image. The diaphragm shutter 102 and the second lens group 103 are capable of an integral advancing/retracting operation in the optical axis direction OA.

Interlocking the advancing/retracting operation of the second lens group 103 and the advancing/retracting operation of the first lens group 101 realizes a zoom function. Further, the focus lens 104 is capable of performing an advancing/retracting operation in the optical axis direction OA, and an object distance (in-focus distance) at which the photographing lens 105 is in focus is changed depending on a position of the focus lens 104. The position of the focus lens 104 in the optical axis direction OA is controlled to perform focusing, which is an operation of adjusting the in-focus distance of the photographing lens 105.

The lens driving/controlling system 119 is configured to drive or control the lens unit 100. The lens driving/controlling system 119 includes a zoom actuator 111, a diaphragm shutter actuator 112, a focus actuator 113, a zoom driving circuit 114, a diaphragm shutter driving circuit 115, a focus driving circuit 116, and a lens microprocessor unit (MPU) 117. The lens driving/controlling system 119 further includes a lens memory 118.

The zoom driving circuit 114 is configured to use the zoom actuator 111 to drive the first lens group 101 or the second lens group 103 in the optical axis direction OA, to thereby control an angle of field of an optical system of the lens unit 100. The diaphragm shutter driving circuit 115 is configured to use the diaphragm shutter actuator 112 to drive the diaphragm 102, to thereby control an aperture diameter or an opening/closing operation of the diaphragm 102. The focus driving circuit 116 is configured to use the focus actuator 113 to drive the focus lens 104 in the optical axis direction OA, to thereby control an in-focus distance of the optical system of the lens unit 100. The focus driving circuit 116 is also configured to use the focus actuator 113 to detect a current position of the focus lens 104.

The lens MPU 117 is configured to perform various computing processing for the lens unit 100, to thereby control the entire lens unit 100. The lens MPU 117 controls the zoom driving circuit 114, the diaphragm shutter driving circuit 115, the focus driving circuit 116, and the lens memory 118. Moreover, the lens MPU 117 is connected to a camera MPU 125 via the mount M to communicate commands and data. For example, the lens MPU 117 is configured to detect a position of the focus lens 104 or the like, and to notify the camera MPU 125 of lens information based on a request from the lens MPU 125. The lens information contains information on the position in the optical axis direction OA of the focus lens 104, and a position in the optical axis direction OA and a diameter of an exit pupil 400 (see FIG. 4) of the optical system 133. The lens information also contains a position in the optical axis direction OA and a diameter of a lens frame (not shown), which is configured to limit light fluxes passing through the exit pupil 400, and other such information.

The lens MPU 117 is also configured to control the zoom driving circuit 114, the diaphragm shutter driving circuit 115, and the focus driving circuit 116 in response to a request from the camera MPU 125. In the lens memory 118, optical information required for automatic focus detection (autofocus) and other such information are stored in advance. The camera MPU 125 is configured to execute programs stored in a non-volatile memory (not shown), which is included in the camera MPU 125, or the lens memory 118, for example, to control operation of the lens unit 100.

Next, the main body, that is, the image pickup apparatus main body (camera main body) 120 of the image pickup apparatus 10 according to this embodiment is described.

The image pickup apparatus main body 120 includes an optical system, which includes an optical low pass filter 121 and the image pickup element 122, and an image pickup apparatus driving/controlling system (camera controlling/driving system) 131. The optical system including the optical low pass filter 121 and the image pickup element 122 forms a part of the image pickup optical system 133. The first lens group 101, the diaphragm 102, the second lens group 103, and the focus lens 104 of the lens unit 100, and the optical low pass filter 121 and a microlens 305 (see FIG.

3A and FIG. 3B) of the image pickup apparatus main body 120 together form the photographing optical system 133.

The optical low pass filter 121 is configured to reduce false color and moire of the taken image.

The image pickup element 122 is, for example, a CMOS image sensor. The image pickup element 122 has a pupil division function, and may output a signal for performing phase-difference focus detection (image pickup surface phase-difference AF, phase-difference AF) using image data.

An image processing circuit 124 is configured to generate, based on the image data output from the image pickup element 122, phase-difference AF data, and image data for display, recording, and contrast AF (TVAF).

The image pickup apparatus controlling/driving system 131 includes the image pickup element driving circuit (sensor driving circuit) 123, the image processing circuit 124, the camera MPU 125, a display device 126, an operation switch group 127, a memory 128, and an image pickup surface phase-difference focus detection part (phase-difference AF part) 129. The image pickup apparatus controlling/driving system 131 further includes a TVAF focus detection part (TVAF part) 130.

The image pickup element driving circuit 123 is configured to control the operation of the image pickup element 122. The image pickup element driving circuit 123 is configured to subject the image signal acquired by the image pickup element 122 to A/D conversion, and to transmit the image signal subjected to A/D conversion to the camera MPU 125 and the image processing circuit 124. The image processing circuit 124 is configured to perform general image processing on the image data acquired by the image pickup element 122. Examples of the general image processing include γ conversion, white balance adjustment processing, color interpolation processing, and compression coding. Moreover, the image processing circuit 124 is also configured to generate a phase-difference AF signal.

The camera MPU (image pickup element MPU) 125 is configured to perform various computing processing for the image pickup apparatus main body 120, to thereby control the entire image pickup apparatus main body 120. The camera MPU 125 is configured to control the image pickup element driving circuit 123, the image processing circuit 124, the display device 126, the operation switch group 127, the memory 128, the image pickup surface phase-difference focus detection part 129, and the TVAF focus detection part 130. The camera MPU 125 is connected to the lens MPU 117 via a signal line of the mount M, and is configured to communicate the commands and data to/from the lens MPU 117.

The camera MPU 125 is configured to issue various requests to the lens MPU 117. Examples of the requests made by the camera MPU 125 to the lens MPU 117 include a lens information acquiring request for requesting acquisition of the lens information, and a diaphragm driving request for requesting drive of the diaphragm 102 by a predetermined driving amount. The camera MPU 125 is configured to also issue, to the lens MPU 117, a focus lens driving request for requesting drive of the focus lens 104 by a predetermined driving amount, a zoom driving request, an optical information acquiring request for acquiring optical information unique to the lens unit 100, and other requests. The camera MPU 125 includes a read-only memory (ROM) 125a, which configured to store programs for controlling the operation of the image pickup apparatus 10 and others, a random access memory (RAM) 125b, which is configured to store variables and others, and an electrically erasable programmable ROM (EEPROM) 125c, which is configured to store various parameters and others.

The camera MPU 125 may function as a signal acquisition unit configured to acquire a first focus detection signal, a second focus detection signal, and a third focus detection signal, which are to be described later, using the image pickup element 122 or the like. Moreover, the camera MPU 125 may also function as a defocus state detection unit configured to detect a defocus state of the photographing optical system 133 based on at least one of the first focus detection signal or the second focus detection signal, and the third focus detection signal.

The camera MPU 125 may also function as a signal selection unit configured to select at least one of the first focus detection signal or the second focus detection signal based on F-numbers of light fluxes respectively corresponding to the first focus detection signal and the second focus detection signal. Moreover, the camera MPU 125 may also function as a signal selection unit configured to select at least one of the first focus detection signal or the second focus detection signal based on a magnitude relationship between the first focus detection signal and the second focus detection signal.

The camera MPU 125 may further function as a reliability determination unit configured to determine reliability of the defocus amount detected by the image pickup surface phase-difference focus detection part 129 based on a detection result of the defocus state of the image pickup optical system 133. Moreover, the camera MPU 125 may still further function as a threshold setting unit configured to set a threshold for an evaluation value EV_DFD, which is to be described later.

The display device 126 includes an LCD and other components. The display device 126 is configured to display information relating to a photographing mode of the image pickup apparatus 10, a preview image prior to photographing, a confirming image after photographing, a display image in an in-focus state at the time of focus detection, and other images. The operation switch group 127 includes a power supply switch, a release (photographing trigger) switch, a zoom operation switch, a photographing mode selecting switch, and other switches. The memory 128 is, for example, a removable memory, such as a flash memory. The memory 128 is configured to record a taken image and others.

The image pickup surface phase-difference focus detection part 129 is configured to perform phase-difference focus detection processing using focus detection data, which is obtained by performing the image processing by the image processing circuit 124. More specifically, the image processing circuit 124 is configured to generate, as focus detection data, an image data pair formed by the light fluxes passing through a pair of pupil regions (pupil partial regions) of the photographing optical system 133. Then, the image pickup surface phase-difference focus detection part 129 is configured to detect a focus shift amount based on a shift amount between the image data pair. In this manner, the image pickup surface phase-difference focus detection part 129 is configured to perform the phase-difference AF (image pickup surface phase-difference AF) based on the output of the image pickup element 122 without using a dedicated AF sensor. Details of the operation of the image pickup surface phase-difference focus detection part 129 are described later.

The image pickup surface phase-difference focus detection part 129 may function as a defocus amount detection unit configured to detect the defocus amount of the photographing optical system 133 based on the correlation between the first focus detection signal and the second focus detection signal.

The TVAF focus detection part 130 is configured to perform contrast focus detection processing (TVAF) based on TVAF evaluation value (contrast information of the image data), which is generated by the image processing performed by the image processing circuit 124. In the contrast focus detection processing, the focus lens 104 is moved in the optical axis direction OA, and a position of the focus lens 104 at which the TVAF evaluation value peaks is detected as an in-focus position.

In this manner, the image pickup apparatus 10 according to this embodiment is capable of executing both the phase-difference AF and the TVAF, and may selectively execute the phase-difference AF or the TVAF, or execute the phase-difference AF and the TVAF in combination depending on the situation.

Figure 2:
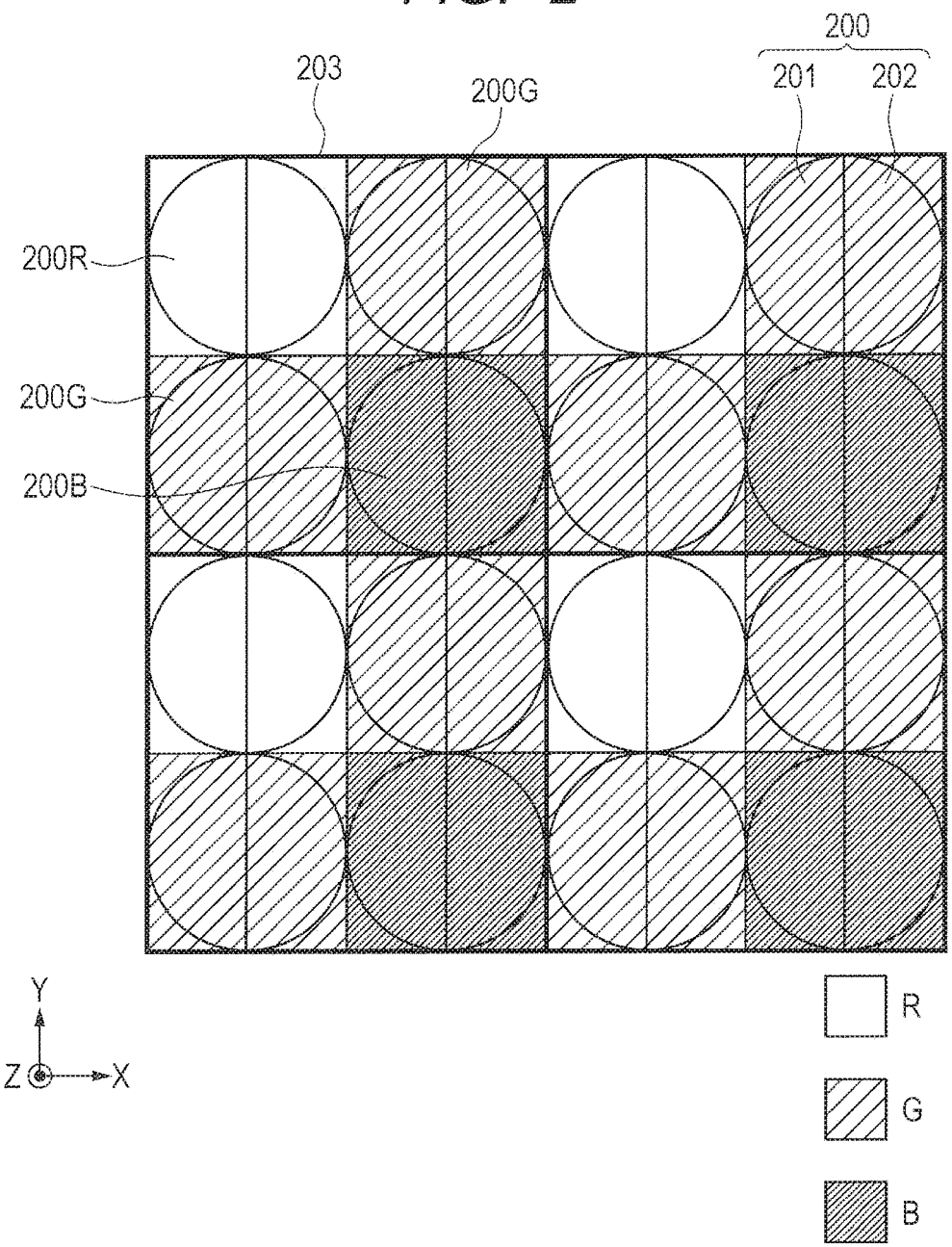
FIG. 2 is a plan view for illustrating a part of an image pickup element of the image pickup apparatus according to the one embodiment of the present invention.

Next, the image pickup element 122 to be used in the image pickup apparatus 10 according to this embodiment is described. FIG. 2 is a plan view for illustrating a part of the image pickup element 122 to be used in the image pickup apparatus 10 according to this embodiment.

The image pickup element 122 to be used in this embodiment is, as described above, a CMOS image sensor, for example. In the image pickup surface of the image pickup element 122, that is, the pixel array region (not shown) of the image pickup element 122, image pickup pixels (pixels) 200 (see FIG. 2) are two-dimensionally arranged, that is, arranged in matrix. Around the pixel array region, peripheral circuits (not shown) including a read-out circuit are arranged. In FIG. 2, reference symbol 200R is used to represent an image pickup pixel responding to red color (R), reference symbol 200G is used to represent an image pickup pixel responding to green color (G), and reference symbol 200B is used to represent an image pickup pixel responding to blue color (B). Reference symbol 200 is used to describe the image pickup pixel unless otherwise required to particularly distinguish the responding colors.

Each of the image pickup pixels 200 includes two divided pixels (divided regions) 201 and 202. That is, each of the image pickup pixels 200 includes a first divided pixel 201 and a second divided pixel 202 arranged in 2 columns and 1 row. The center of gravity of the first divided pixel 201 is decentered in a −X direction in the image pickup pixel 200. The center of gravity of the second divided pixel 202 is decentered in a +X direction in the image pickup pixel 200.

In FIG. 2, the arrangement of the image pickup pixels 200 of 4 columns and 4 rows is extracted and illustrated. One image pickup pixel 200 includes two divided pixels 201 and 202, and hence, in FIG. 2, the arrangement of the divided pixels 201 and 202 of 8 columns and 4 rows is extracted and illustrated.

The image pickup pixels 200 of 2 columns and 2 rows form one pixel group 203. In FIG. 2, each of the pixel groups 203 is represented with use of the thick solid lines. One pixel group 203 includes one image pickup pixel 200R responding to red color, two image pickup pixels 200G responding to green color, and one image pickup pixel 200B responding to blue color. The image pickup pixel 200R responding to red color is arranged at an upper left position of the pixel group 203. The image pickup pixels 200G responding to green color are arranged at upper right and lower left positions of the pixel group 203. The image pickup pixel 200B responding to blue color is arranged at a lower right position of the pixel group 203. Such a pixel arrangement is called a Bayer pattern.

A large number of the pixel groups 203 as described above are arranged two-dimensionally on an image pickup surface (light receiving surface) of the image pickup element 122, and hence the image pickup element 122 can acquire a clear and highly-accurate taken image.

A pitch (cycle) P of the image pickup pixels 200 is set to, for example, 4 μm. The number N of the image pickup pixels 200 arranged in a horizontal direction (X axis direction) is set to, for example, 5,575, and the number of the image pickup pixels 200 arranged in a perpendicular direction (Y axis direction) is set to, for example, 3,725. That is, the number N of pixels (effective pixel number) of the image pickup element 122 is set to, for example, about 20,750,000 pixels. The horizontal direction (lateral direction) of the image pickup element 122 (right-left direction of FIG. 2) is represented by an X axis direction, and the perpendicular direction (vertical direction) of the image pickup element 122 (up-down direction of FIG. 2) is represented by a Y axis direction. Further, a direction normal to the image pickup surface of the image pickup element 122 (normal direction of FIG. 2) is represented by a Z axis direction.

As described above, each of the image pickup pixels 200 includes the first divided pixel 201 and the second divided pixel 202 arranged in 2 columns and 1 row. Therefore, a pitch (cycle) $P_{AF}$ of the divided pixels 201 and 202 in the horizontal direction (X axis direction) is, for example, 2 μm. The number of the divided pixels 201 and 202 in the horizontal direction (X axis direction) is, for example, 11,150. The number of the divided pixels 201 and 202 in the perpendicular direction (Y axis direction) is, for example, 3,725. The number $N_{AF}$ of the divided pixels of the image pickup element 122 is, for example, about 41,500,000 pixels.

FIG. 3A and FIG. 3B are respectively a plan view and a sectional view for illustrating a pixel portion of the image pickup element. FIG. 3A is a plan view for illustrating the pixel portion of the image pickup element 122, and FIG. 3B is a sectional view taken along the line I-I' of FIG. 3A. In FIG. 3B, an optical axis 303 is represented by using the dashed-dotted line, and a light receiving surface (image pickup surface) 304 of the image pickup element 122 is represented by using the broken line. In FIG. 3A and FIG. 3B, one of the plurality of pixels (image pickup pixels, pixel portions) 200 of the image pickup element is extracted and illustrated.

As illustrated in FIG. 3A and FIG. 3B, each of the image pickup pixels 200 is divided into a plurality of regions (divided pixels) 201 and 202. Specifically, the image pickup pixel 200 is divided into two regions in the X direction, but is not divided in the Y direction. As described above, in this embodiment, each of the image pickup pixels 200 is divided into the two regions 201 and 202.

In a substrate 300 of one divided pixel 201, a photoelectric converter (first photoelectric converter) 301 of the first divided pixel 201 is formed. In the substrate 300 of the other divided pixel 202, a photoelectric converter (second photoelectric converter) 302 of the second divided pixel 202 is formed. The center of gravity of the first photoelectric converter 301 is decentered in the −X direction. The center of gravity of the second photoelectric converter 302 is decentered in the +X direction.

Examples of the photoelectric converters 301 and 302 include a p-i-n structure photodiode in which an intrinsic layer is sandwiched between a p-type layer and an n-type layer.

Each of the photoelectric converters 301 and 302 is not limited to a p-i-n structure photodiode, and may be a p-n junction photodiode in which the intrinsic layer is omitted.

On the substrate 300 having the photoelectric converters 301 and 302 formed therein, an insulating layer 311, a wiring layer 307, and other layers are formed as appropriate. On the substrate 300 having the insulating layer 311, the wiring layer 307, and other layers formed thereon, a color filter 306 is formed.

The spectral transmittance of the color filter 306 may be varied for each of the image pickup pixels 200R, 200G, and 200B, or the color filter 306 may be omitted as appropriate.

On the substrate 300 having the color filter 306 formed thereon, a microlens is arranged, which is configured to collect light entering each of the image pickup pixels 200.

The light entering each of pixel portions 200 is collected by the microlens 305 to be dispersed by the color filter 306, and then reaches the first photoelectric converter 301 and the second photoelectric converter 302.

In the first photoelectric converters 301 and second photoelectric converters 302, electrons and holes are pair-produced based on the received light amount. The pair-produced electrons and holes are separated at a depletion layer. The electrons being negative charges are accumulated in n-type layers 309 and 310, and the holes being positive charges are discharged outside of the image pickup element 122 through p-type layers connected to a constant voltage source (not shown).

The electrons accumulated in the respective n-type layers 309 and 310 of the first photoelectric converters 301 and the second photoelectric converters 302 are transferred to a capacitance portion (FD) (not shown) via a transfer gate (not shown), to thereby be converted into voltage signals so that the voltage signals are output.

Figure 4:
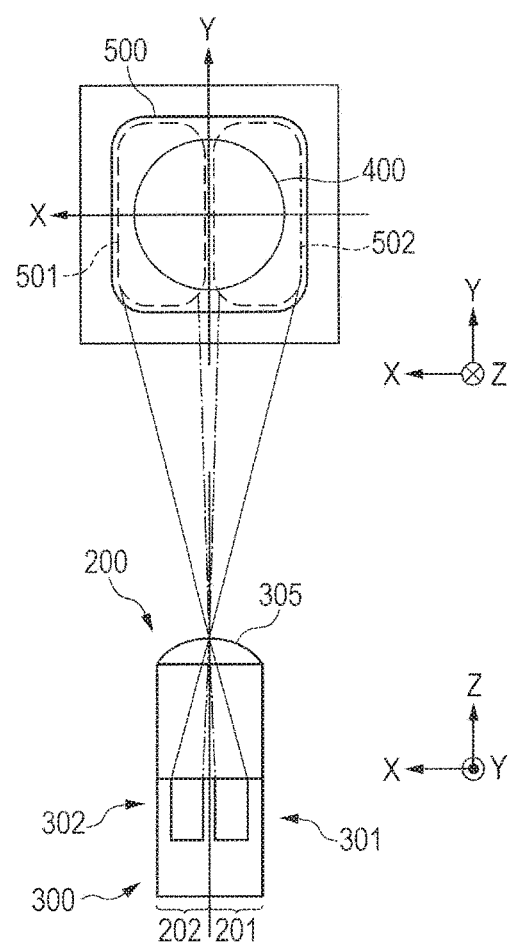
FIG. 4 is a schematic diagram for illustrating a relationship between an exit pupil and the pixel portion.

FIG. 4 is a schematic diagram for illustrating a relationship between the pupil region and the pixel portion. The diagram in the lower part of FIG. 4 is a sectional view of the pixel portion, and the diagram in the upper part of FIG. 4 is a plan view of an exit pupil plane as viewed from the pixel portion side.

As illustrated in FIG. 4, a pupil region 500 includes a first pupil partial region 501 and a second pupil partial region 502. The center of gravity of the first pupil partial region 501 is decentered in the +X direction in the pupil region 500. On the other hand, as described above, the center of gravity of the first divided pixel 201 is decentered in the −X direction in the image pickup pixel 200. Further, the microlens 305 is present between the pupil region 500 and the pixel portion 200. Therefore, the first pupil partial region 501 and the first divided pixel 201 have a conjugate relationship, and the light flux passing through the first pupil partial region 501 is received in the first divided pixel 201.

The center of gravity of the second pupil partial region 502 is decentered in the −X direction in the pupil region 500. On the other hand, as described above, the center of gravity of the second divided pixel 202 is decentered in the +X direction in the image pickup pixel 200. Further, the microlens 305 is present between the pupil region 500 and the pixel portion 200. Therefore, the second pupil partial region 502 and the second divided pixel 202 have a conjugate relationship, and the light flux passing through the second pupil partial region 502 is received in the second divided pixel 202.

As described above, the pupil region 500 includes the first pupil partial region 501 and the second pupil partial region 502. Further, as described above, the image pickup pixel 200 includes the first divided pixel 201 and the second divided pixel 202. Therefore, the light fluxes passing through the pupil region 500 including the first pupil partial region 501 and the second pupil partial region 502 are received by the image pickup pixel 200 including the first divided pixel 201 and the second divided pixel 202.

Figure 5:
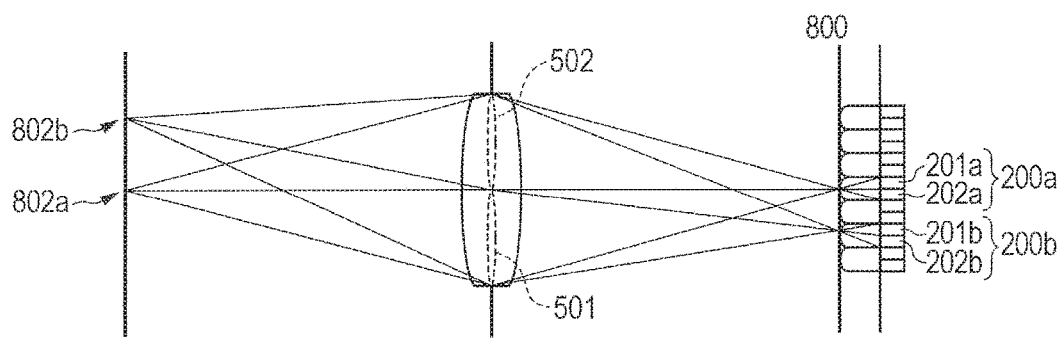
FIG. 5 is a schematic diagram for illustrating a relationship between the exit pupil and the image pickup element.

FIG. 5 is a schematic diagram for illustrating a relationship between the exit pupil and the image pickup element.

A plurality of light fluxes emitted from a certain point 802a respectively pass through the different pupil partial regions 501 and 502 to be received by a first divided pixel 201a and a second divided pixel 202a of a certain pixel 200a, respectively.

Further, a plurality of light fluxes emitted from another point 802b respectively pass through the different pupil partial regions 501 and 502 to be received by a first divided pixel 201b and a second divided pixel 202b of another pixel 200b, respectively.

Here, a case where the pupil region 500 is divided into two regions in the horizontal direction (X direction) has been described as an example, but the present invention is not limited thereto. As necessary, the pupil region 500 may be divided in the perpendicular direction (Y direction).

Further, a case where the image pickup pixel 200 includes the first divided pixel 201 and the second divided pixel 202 has been described here as an example, but a first focus detection pixel and a second focus detection pixel may be arranged as appropriate separately from the image pickup pixel 200.

A first focus detection signal (first focus detection image data, image A signal) is formed of an aggregate of signals (received light signals) detected by the respective first divided pixels 201 of the image pickup pixels 200 arranged in matrix in the image pickup element 122. Further, a second focus detection signal (second focus detection image data, image B signal) is formed of an aggregate of signals (received light signals) detected by the respective second divided pixels 202 of the image pickup pixels 200 arranged in matrix in the image pickup element 122. The thus obtained first focus detection signal and second focus detection signal are used for focus detection. Further, an image pickup signal of the effective pixel number N (image pickup image, image A+B signal) is formed of an aggregate of signals obtained by adding signals detected by the respective first divided pixels 201 and signals detected by the respective second divided pixels 202.

Figure 6:
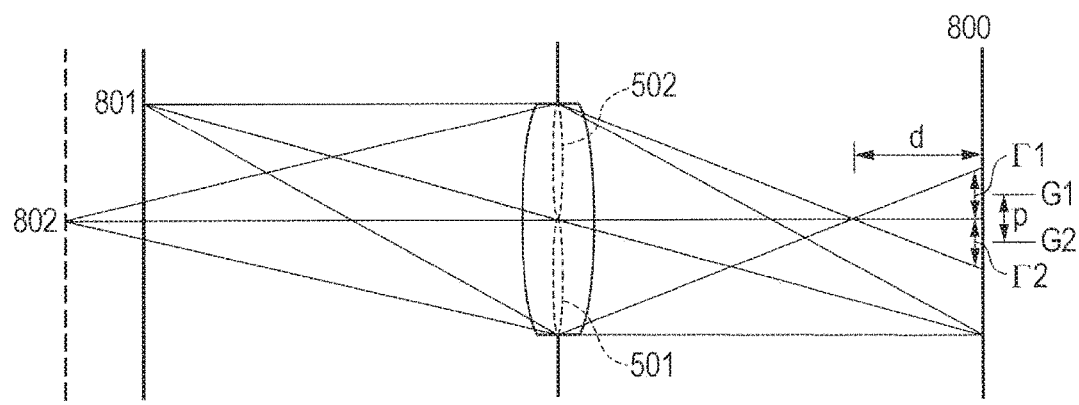
FIG. 6 is a diagram for illustrating a relationship between a defocus amount and an image shift amount.

Next, a relationship between the defocus amount and the image shift amount is described with reference to FIG. 6. FIG. 6 is a diagram for illustrating the relationship between the defocus amount and the image shift amount. The above-mentioned image pickup element 122 is arranged at an image pickup surface 800, but the illustration thereof is omitted in FIG. 6. As described above with reference to FIG. 4 and FIG. 5, the exit pupil 400 of the photographing optical system 133 is divided into two regions, that is, the first pupil partial region 501 and the second pupil partial region 502.

Symbol d in FIG. 6 represents a distance between an imaging position (imaging point) of the object and the image pickup surface 800, that is, a defocus amount. The magnitude of the defocus amount d is represented by |d|. Under a state in which the imaging position of the object is located on the front side of the image pickup surface 800, that is, in a front focus state, the sign of the defocus amount is negative (d<0). Under a state in which the imaging position of the object is located on the rear side of the image pickup surface 800, that is, in a rear focus state, the sign of the defocus amount is positive (d>0). Under a state in which the imaging position of the object is located at the image pickup surface 800, that is, in an in-focus state, the defocus amount d is 0.

When an object 801 is located as illustrated in FIG. 6, the in-focus state (d=0) is obtained. Further, when an object 802 is located as illustrated in FIG. 6, the front focus state (d<0) is obtained. Both of the front focus state (d<0) and the rear focus state (d>0) correspond to a defocus state (|d|>0).

In the front focus state (d<0), among the light fluxes emitted from the object 802, the light fluxes passing through the first pupil partial region 501 are collected on the front side of the image pickup surface 800, and then are spread with a width Γ1 having a gravity-center position G1 of the light fluxes as the center, to thereby form a blurred image on the image pickup surface 800. The blurred image reaching the image pickup surface 800 is received by the first divided pixel 201 of the image pickup pixel 200 arranged in the image pickup element 122, to thereby generate the first focus detection signal. In this manner, the image of the object 802 with the blur width of Γ1 is detected as the first focus detection signal (image A signal) at the gravity-center position G1 on the image pickup surface 800.

Further, in the front focus state (d<0), among the light fluxes emitted from the object 802, the light fluxes passing through the second pupil partial region 502 are collected on the front side of the image pickup surface 800, and then are spread with a width Γ2 having a gravity-center position G2 of the light fluxes as the center, to thereby form a blurred image on the image pickup surface 800. The blurred image reaching the image pickup surface 800 is received by the second divided pixel 202 of the image pickup pixel 200 arranged in the image pickup element 122, to thereby generate the second focus detection signal. In this manner, the image of the object 802 with the blur width of Γ2 is detected as the second focus detection signal (image B signal) at the gravity-center position G2 on the image pickup surface 800.

The blur widths Γ1 and Γ2 of the object image are increased substantially in proportion to the increase of the magnitude |d| of the defocus amount d. Further, a magnitude |p| of an image shift amount p between the object image represented by the first focus detection signal and the object image represented by the second focus detection signal (difference between the gravity-center positions of the light fluxes (G1−G2)) is also increased substantially in proportion to the increase of the magnitude |d| of the defocus amount d.

The case of the rear focus state (d>0) is similar to the case of the front focus state except that the direction of the image shift between the object image represented by the first focus detection signal and the object image represented by the second focus detection signal is opposite to the direction of the case of the front focus state.

The defocus amount and the image shift amount have the above-mentioned relationship therebetween. That is, as the magnitude of the defocus amount d is increased, the magnitude of the image shift amount p between the object image represented by the first focus detection signal and the object image represented by the second focus detection signal is increased. Such a relationship is satisfied, and hence the defocus amount d can be calculated based on the image shift amount p, that is, the phase difference. The focus detection in which the defocus amount is detected based on the phase difference (image shift amount) is referred to as phase-difference focus detection.

The image pickup apparatus 10 according to this embodiment may perform not only the phase-difference focus detection but also the DFD focus detection. The DFD focus detection is described later.

Figure 7:
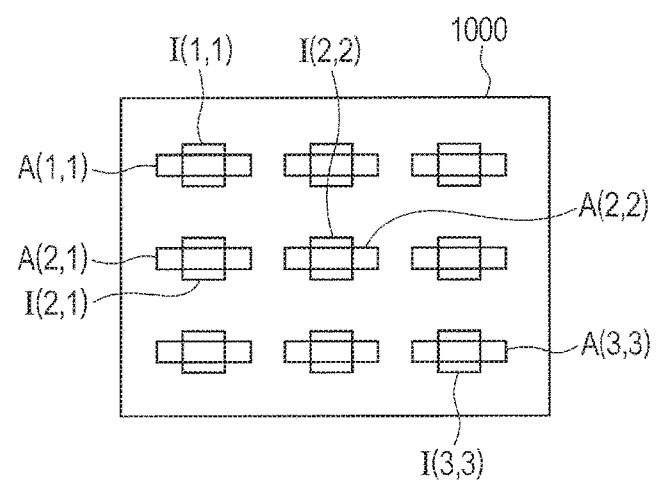
FIG. 7 is a view for illustrating an example of a focus detection region.

Next, the focus detection region is described with reference to FIG. 7. FIG. 7 is a view illustrating an example of the focus detection region. In FIG. 7, focus detection regions in an effective pixel region 1000 of the image pickup element 122, and indices, which indicate focus detection regions and are displayed on the display device 126 during the focus detection, are illustrated in a superimposed manner. In this embodiment, a total of nine (three in a perpendicular direction and three in a horizontal direction) focus detection regions are set. A focus detection region located n-th in the perpendicular direction and n-th in the horizontal direction is expressed as A(n,m). An index of the focus detection region located n-th in the perpendicular direction and m-th in the horizontal direction is expressed as I(n,m). The first focus detection signal and the second focus detection signal respectively acquired by the first divided pixel 201 and the second divided pixel 202, which are located in a focus detection region A(n,m), are used to perform focus detection, which is to be described later, and other such processing.

In this embodiment, the case where three focus detection regions A(n,m) are set in each of the perpendicular direction and the horizontal direction has been described as an example, but the present invention is not limited thereto. The number, positions, and a size of the focus detection regions A(n,m) may be set as appropriate. For example, a predetermined range around a region specified by a photographer may be set as the focus detection region A(n,m).

Figure 8:
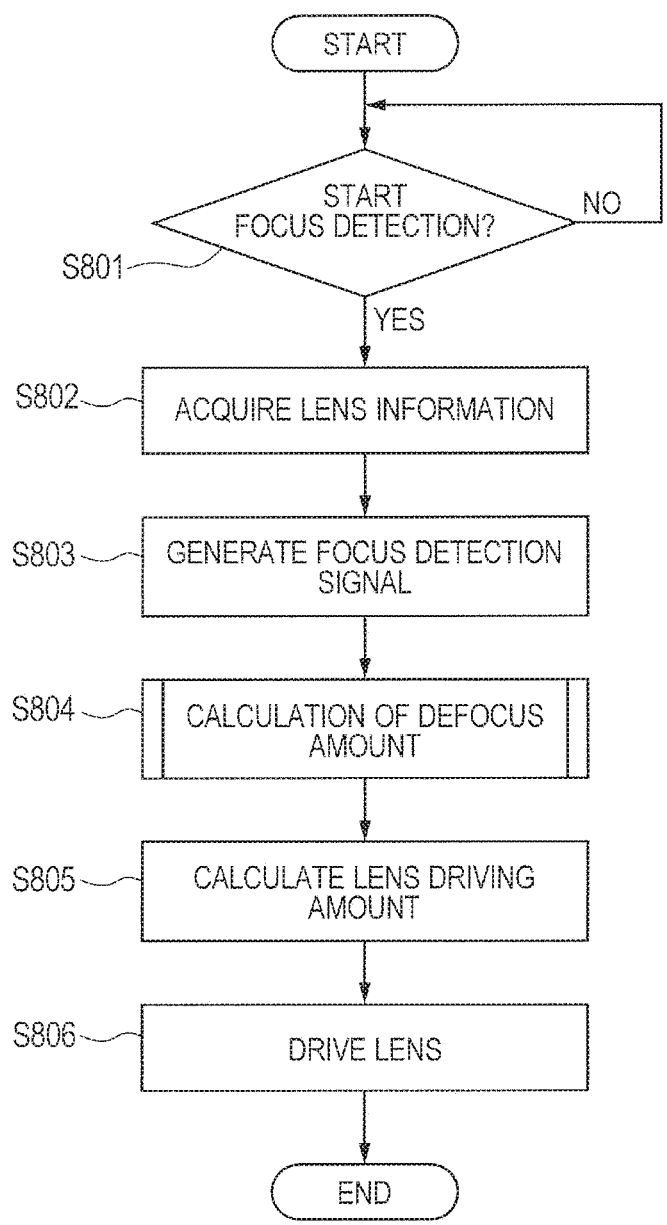
FIG. 8 is a flow chart for illustrating a focusing operation in the image pickup apparatus according to the one embodiment of the present invention.

Next, the focusing operation in the image pickup apparatus 10 according to this embodiment is described with reference to FIG. 8. FIG. 8 is a flow chart for illustrating the focusing operation in the image pickup apparatus according to this embodiment. The focusing operation illustrated in FIG. 8 is performed during live view display, that is, while taking a display moving image, or while recording the moving image, that is, while taking a recording moving image. Here, a case where the output of the image pickup element 122 is used to perform the phase-difference automatic focus detection is described as an example. However, the present invention is not limited thereto, and the contrast automatic focus detection may be performed as described above.

First, the camera MPU 125 determines whether or not an instruction to start focus detection has been input by operation of the operation switch group 127 or the like (Step S801). When the instruction to start the focus detection has been input (YES in Step S801), the processing proceeds to Step S802. On the other hand, when the instruction to start the focus detection has not been input (NO in Step S801), the processing waits, that is, repeats Step S801. Here, the case where a trigger for proceeding to Step S802 is the input of the instruction to start the focus detection has been described as an example, but the present invention is not limited thereto. For example, start of the live view display or start of the recording of the moving image may be used as a trigger for proceeding to Step S802.

Next, the camera MPU 125 acquires various kinds of lens information, such as information on the lens frame of the lens unit 100 and information on the position of the focus lens 104, from the lens MPU 117 via the mount M (Step S802).

Next, the camera MPU 125 instructs the image processing circuit 124 to generate the first focus detection signal (image A) and the second focus detection signal (image B), which are AF image signals (Step S803). The image processing circuit 124 generates the first focus detection signal (image A) and the second focus detection signal (image B) from pixel data of a portion corresponding to the focus detection region A(n,m) of image data of frames that are being successively read. The first focus detection signal (image A) and the second focus detection signal (image B) generated by the image processing circuit 124 are transmitted to the image pickup surface phase-difference focus detection part 129. Processing for correcting a difference in signal level, which is generated because a size of the photoelectric converter is different for a focus detection pixel and a photographing pixel, and other such processing are performed by the image pickup surface phase-difference focus detection part 129, for example.

Next, the image pickup surface phase-difference focus detection part 29 applies known correlation computing and the like on the first focus detection signal (image A) and the second focus detection signal (image B), that is, a pair of image signals to calculate an image shift amount. Then, the image pickup surface phase-difference focus detection part 129 converts the calculated image shift amount into a defocus amount (Step S804). The image pickup surface phase-difference focus detection part 129 also determines reliability of the detected defocus amount. Details of the processing for determining the reliability of the defocus amount are described later. The image pickup surface phase-difference focus detection part 129 outputs the calculated defocus amount to the camera MPU 125.

Next, the camera MPU 125 calculates, based on the defocus amount calculated by the image pickup surface phase-difference focus detection part 129, a driving amount, that is, a lens driving amount of the lens unit 100 with respect to the focus lens 104 (Step S805).

Next, the camera MPU 125 transmits the lens driving amount and information on a driving direction to the focus driving circuit 116 of the lens unit 100 via the mount M (Step S806). The focus driving circuit 116 drives the focus lens 104 based on the lens driving amount and the information on the driving direction, which have been received. In this manner, the focusing in the lens unit 100 is performed. The focusing operation illustrated in FIG. 8 may be performed every time moving image data of each frame forming a moving image is acquired.

Next, the processing for calculating the defocus amount (Step S804), which has been described above with reference to FIG. 8, is further described with reference to FIG. 9. The processing for calculating the defocus amount, which is illustrated in FIG. 9, may be mainly performed by the camera MPU 125, or may be performed by a processing unit provided separately from the camera MPU 125.

First, the image pickup surface phase-difference focus detection part 129 performs correlation computing between the image A and the image B, which are output from pixels located in the same row (here, m-th row) (Step S901). A correlation amount COR1(k) used in the correlation computing between the image A and the image B may be calculated by the following expression (1), for example, where $-k_{max} \leq k \leq k_{max}$.

$$COR1(k) \Sigma_{i=1}^{N-1-2 \times kmax} |A(m,i-k) - GA(m,i+k)| \qquad (1)$$

The variable k used in the expression (1) indicates a shift amount during the correlation computing, and is an integer of from $-k_{max}$ or more to $k_{max}$ or less. After determining the correlation amount COR1(k) for each shift amount k, the image pickup surface phase-difference locus detection part 129 determines a value of a shift amount k at which the correlation amount between the image A and the image B is maximized, that is, a shift amount k at which the correlation amount COR1(k) is minimized. The shift amount k set in calculating the correlation amount COR1(k) is an integer, but in determining the shift amount k at which the correlation amount COR1(k) is minimized, it is preferred that interpolation processing or the like be performed as appropriate to calculate the defocus amount at high accuracy. When the interpolation processing or the like is performed, the defocus amount may be determined on the order of a subpixel.

In this embodiment, a shift amount dk at which a sign of a difference value between correlation amounts COR1(k) changes is calculated as a shift amount k at which the correlation amount COR1(k) is minimized.

That is, the image pickup surface phase-difference focus detection part 129 first calculates the difference value DCOR1 between the correlation amounts by the following expression (2).

$$DCOR1(k) = COR1(k) - COR1(k-1) \qquad (2)$$

Then, the image pickup surface phase-difference focus detection part 129 determines, using the difference value DCOR1 between the correlation amounts, the shift amount dk1 at which the sign of the difference value changes. A value of k immediately before the sign of the difference value changes is represented by k1, and a value of k at which the sign of the difference value changes is represented by k2 (k2=k1+1). The image pickup surface phase-difference focus detection part 129 calculates the shift amount dk1 by the following expression (3).

$$dk1 = k1 + |DCOR1(k1)| / |DCOR1(k1) - DCOR1(k2)| \qquad (3)$$

In this manner, the image pickup surface phase-difference focus detection part 129 calculates the shift amount dk1 at which the correlation amount between the first focus detection signal (image A) and the second focus detection signal (image B) is maximized on the order of a subpixel, and completes the processing of Step S901.

A method of calculating a phase difference between two one-dimensional image signals is not limited to the above-mentioned method, and any known method may be used as appropriate.

Next, signals to be used in performing the DFD processing are selected (Step S902). In the DFD processing, signals obtained by receiving light fluxes with different F-numbers are used, and a degree of matching of the signals is detected to detect a defocus state. How the image is blurred in the defocus state is significantly different for the F-number. Therefore, in the defocus state, the degree of matching of the signals obtained from the light fluxes with the different F-numbers is relatively low. On the other hand, in an in-focus state, the degree of matching of the signals obtained from the light fluxes with the different F-numbers is relatively high. In the DFD processing performed in this embodiment, such phenomenon is utilized to detect the defocus state. In this manner, in performing the DFD processing, a plurality of signals respectively obtained from light fluxes with different F-numbers are required. The plurality of signals respectively obtained from the light fluxes with the different F-numbers include the following three signals, for example. The first one is a third focus detection signal (third signal), which is the image A+B signal. The second one is the first focus detection signal (first signal), which is the image A signal. The third one is the second focus detection signal (second signal), which is the image B signal.

In order to align the magnitude of the first focus detection signal, the second focus detection signal, and the third focus detection signal, that is, for the purpose of normalization, in this embodiment, an average value between the image A signal and the image B signal is used as the third focus detection signal.

As the image pickup signal, not the average value between the image A signal and the image B signal, but a sum value of the image A signal and the image B signal is used.

The third focus detection signal (image A+B signal) is a signal obtained from a light flux with a relatively small F-number. In contrast, the first focus detection signal (image A signal) and the second focus detection signal (image B signal) are signals obtained from light fluxes with relatively large F-numbers. Therefore, in the DFD processing, the third focus detection signal (image A+B signal) is used as the signal obtained from the light flux with the relatively small F-number. Meanwhile, at least one of the first focus detection signal (image A signal) or the second focus detection signal (image B signal) is used as the signal obtained from the light flux with the relatively large F-number. In S902, selection as to which signal is to be used as the signal obtained from the light flux with the relatively large F-number is performed. In Step S902, there may be the following cases: both of the first focus detection signal (image A signal) and the second focus detection signal (image B signal) are selected; the first focus detection signal is selected; and the second focus detection signal is selected. Details of the DFD processing performed in this embodiment are described later.

The signals to be used in performing the DFD processing are selected based on the information on the photographing optical system 133 and focus detection information. Examples of the information on the photographing optical system 133 include aberration information, vignetting information, such as the position in the optical axis direction OA and the diameter of the lens frame, which is configured to limit the light flux passing through the exit pupil 400, and aperture information, such as a position in the optical axis direction OA and a diameter of the exit pupil 400. Examples of the focus detection information include an angle characteristic of receiving sensitivity of each position in a pixel array region of the image pickup element 122, and position information of the focus detection region A(n,m) on the image pickup element 122. As described above, the DFD processing is performed using the signals obtained from the light fluxes with the different F-numbers, and a difference between the F-numbers may be calculated based on the information on the photographing optical system 133 and the focus detection information, which have been described above.

FIG. 10A to FIG. 10C are schematic views for illustrating shading. An exit pupil distance Dl indicates a distance between the exit pupil 400 and the image pickup element 122 of the photographing optical system 133 in the optical axis direction OA. Moreover, a set pupil distance Ds indicates a distance from an intersection between a direction having the highest sensitivity of angle characteristics of receiving sensitivity at a peripheral image height and the optical axis 303 to the image pickup element 122 in the optical axis direction OA.

In FIG. 10A, a case where the exit pupil distance Dl of the photographing optical system 133 is equal to the set pupil distance Ds of the image pickup element 122 is illustrated. In this case, at both of a center image height and the peripheral image height, light fluxes passing through the exit pupil 400 of the photographing optical system 133 are divided substantially equally by the first pupil partial region 501 and the second pupil partial region 502.

In FIG. 10B, a case where the exit pupil distance Dl of the photographing optical system 133 is shorter than the set pupil distance Ds of the image pickup element 122 is illustrated. In this case, at the peripheral image height, a pupil shift occurs between the exit pupil 400 of the photographing optical system 133 and an entrance pupil of the image pickup element 122. Therefore, the light fluxes passing through the exit pupil 400 of the photographing optical system 133 are unevenly divided by the first pupil partial region 501 and the second pupil partial region 502. In other words, as illustrated in FIG. 10B, in the case where the exit pupil distance Dl of the imaging optical system 133 is shorter than the set pupil distance Ds of the image pickup element 122, the pupil division at the peripheral image height becomes uneven.

In FIG. 10C, a case where the exit pupil distance Dl of the photographing optical system 133 is longer than the set pupil distance Ds of the image pickup element 122 is illustrated. In this case, at the peripheral image height, a pupil shift occurs between the exit pupil 400 of the photographing optical system 133 and the entrance pupil of the image pickup element 122. Therefore, the light fluxes passing through the exit pupil 400 of the photographing optical system 133 are unevenly divided by the first pupil partial region 501 and the second pupil partial region 502. In other words, as illustrated in FIG. 10C, also in the case where the exit pupil distance Dl of the imaging optical system 133 is longer than the set pupil distance Ds of the image pickup element 122, the pupil division at the peripheral image height becomes uneven.

As the pupil division becomes uneven at the peripheral image height, intensities of the first focus detection signal and the second focus detection signal also become uneven. That is, the intensity of one of the first focus detection signal and the second focus detection signal is increased, while the intensity of the other is reduced. Such a phenomenon is called shading.

When the pupil division at the peripheral image height becomes uneven, the intensities of the first focus detection signal and the second focus detection signal also become uneven, and a difference in intensity between the first focus detection signal and the second focus detection signal may be calculated by using various kinds or information. In this embodiment, the exit pupil distance Dl, the information on the diameter of the exit pupil 400, and the focus detection information are used to calculate the difference in intensity between the first focus detection signal and the second focus detection signal. When the information on the frame of the photographing optical system 133, which blocks the light fluxes passing through the exit pupil 400, is further used, the difference in intensity between the first focus detection signal and the second focus detection signal may be calculated more accurately. The thus-performed calculation of the difference in intensity between the first focus detection signal and the second focus detection signal corresponds to calculating the difference in intensity between the first focus detection signal and the second focus detection signal using the image height of the focus detection region, the F-number of the first focus detection signal, and the F-number of the second focus detection signal.

In Step S902, when the difference in intensity between the first focus detection signal and the second focus detection signal is equal to or less than a predetermined threshold, all of the first focus detection signal, the second focus detection signal, and the third focus detection signal are selected as the signals to be used in the DFD processing. On the other hand, when the difference in intensity between the first focus detection signal and the second focus detection signal is more than the predetermined threshold, a signal having the lower intensity of the first focus detection signal and the second focus detection signal, and the third focus detection signal are selected. In such case, the signal having the lower intensity of the first focus detection signal and the second focus detection signal is selected as the signal to be used in the DFD processing to ensure that signals obtained by the light fluxes with sufficiently different F-numbers are used in the DFD processing.

The method of selecting the signals to be used in performing the DFD processing is not limited to the above-mentioned method. In a case where the difference in intensity between the first focus detection signal and the second focus detection signal is large, and a magnitude of one signal is very small, when the smaller signal is adopted, highly accurate DFD processing cannot be performed. Therefore, in such case, the signal having the higher intensity of the first focus detection signal and the second focus detection signal, and the third focus detection signal may be selected as the signals to be used in the DFD processing.

Here, the case where the difference in intensity between the first focus detection signal and the second focus detection signal is calculated has been described as an example, but the present invention is not limited thereto. For example, peak values or integrated values may be compared to determine the magnitude relationship between the first focus detection signal and the second focus detection signal.

Moreover, the signals to be used in the DFD processing may be selected by comparing the intensities of the signals as described above, but the signals to be used in the DFD processing may be selected by using another method. For example, the signals to be used in the DFD processing may be selected depending on a situation of aberrations included in the first focus detection signal and the second focus detection signal.

As described above, in the detection of the defocus state by the DFD processing, when the degree of matching of the signals with the different F-numbers is high, it is determined that the photographing optical system 133 is close to the in-focus state. However, when one of the signals with the different F-numbers is a signal having large aberrations, the degree of matching between those signals is not high even in the in-focus state. Therefore, when the signal having the large aberrations is used, the detection accuracy of the DFD processing is deteriorated. Therefore, there may be contemplated a method in which aberration information on the photographing optical system 133 is acquired, and in which a signal having smaller aberrations of the first focus detection signal and the second focus detection signal. When the signal having the smaller aberrations is used, highly accurate DFD processing may be performed.

In Step S903, it is determined whether or not all of the first focus detection signal (image A signal), the second focus detection signal (image B signal), and the third focus detection signal (image A+B signal) are to be used in the DFD processing. When all of the first to third focus detection signals are to be used in the DFD processing (YES in Step S903), the processing proceeds to Step S905. In Step S905, the DFD processing is performed using all of the first to third focus detection signals.

In the DFD processing, a known method may be used to quantify correlation of the signals obtained by the light fluxes with the different F-numbers. For example, a ratio of powers of respective signals obtained by extracting a predetermined spatial frequency band may be calculated to quantify the correlation of those signals. In other words, the ratio of the powers of the respective signals in a predetermined evaluation band may be calculated to quantify the correlation of those signals.

Specifically, for the third focus detection signal extracted by performing filtering and other such processing, a power P3 of the third focus detection signal I3(k) (1≤k≤n) is calculated by the following expression.

$$P3 = \Sum_{k=1}^{n} I3(k)^2 \quad (4)$$

A power P1 of the first focus detection signal may be calculated similarly. A power P2 of the second focus detection signal may also be calculated similarly.

Then, an evaluation value EV_DFD for determining the defocus state is calculated by the following expression (5), for example.

$$EV\_DFD = P3/(\text{average value between } P1 \text{ and } P2) = (P3/(P1+P2)) \times 2 \quad (5)$$

The evaluation value EV_DFD indicates the ratio of the powers of the signals obtained by the light fluxes with the different F-numbers. The evaluation value EV_DFD approaches a predetermined positive value near the in-focus state, and has a smaller value in the defocus state. For example, near the in-focus state, the evaluation value EV_DFD takes a value close to 1. The evaluation value EV_DFD takes the value close to 1 near the in-focus state because a width of blur of a point image is small, and hence a difference between the focus detection signals with the different F-numbers becomes smaller, with the result that a relationship: P1=P2=P3 is established near the in-focus state.

Meanwhile, in the defocus state, the third focus detection signal, which is the signal obtained by the light flux with the small F-number, has large attenuation in high-frequency components due to the blur as compared to the first focus detection signal and the second focus detection signal, which are the signals obtained by the light fluxes with the large F-numbers. Therefore, as the defocus becomes larger, a relationship: P1=P2>P3 becomes predominant, and the evaluation value EV_DFD is reduced.

In this embodiment, a threshold is set, and a determination on whether or not the photographing optical system 133 is in the in-focus state, in other words, a determination on whether or not the photographing optical system 133 is in the defocus state is performed depending on whether or not the evaluation value EV_DFD exceeds the threshold. For example, when the determination is performed using such an expression that the evaluation value EV_DFD approaches 1 in the in-focus state, the threshold is set to 0.6, for example, and when the evaluation value EV_DFD exceeds the threshold, it is determined that the photographing optical system 133 is in the in-focus state. Meanwhile, when the evaluation value EV_DFD does not exceed the threshold, it is determined that the photographing optical system 133 is in the defocus state.

How much the evaluation value EV_DFD is reduced by the defocus with respect to the evaluation value EV_DFD in the in-focus state is different depending on the F-number of the photographing optical system 133, S/N ratios of the focus detection signals, the frequency band (evaluation band) from which the focus detection signals are extracted, and other such factors. For example, when the F-number small, the attenuation of the focus detection signals caused by the defocus is large, and hence the evaluation, value EV_DFD is changed sufficiently even with a small defocus amount. Moreover, when noise contained in the focus detection signals is large, changes in intensity of the focus detection signals are hard to detect due to the effect of the noise, and hence a change in evaluation value EV_DFD caused by the defocus is hard to detect. Moreover, as the frequency band from which the focus detection signals are extracted becomes higher, attenuation of the powers of the extracted focus detection signals caused by the defocus becomes larger. Therefore, when the frequency band from which the focus detection signals are extracted is set high, the evaluation value EV_DFD is changed sufficiently even with a small defocus amount. In view of those characteristics, the threshold for the evaluation value EV_DFD may be set as appropriate. Specifically, the threshold for the evaluation value EV_DFD may be switched depending on the F-number of the photographing optical system 133. Moreover, the threshold for the evaluation value EV_DFD may be switched based on information on the S/N ratios, such as gains, of the focus detection signals. Moreover, the threshold for the evaluation value EV_DFD may be switched depending on the frequency band from which the focus detection signals are extracted, that is, the evaluation band of the focus detection signals, and other such factors.

Moreover, the frequency band from which the focus detection signals are extracted may be changed depending on the use. When the frequency band from which the focus detection signals are extracted is set high, a change in evaluation value EV_DFD with respect to the defocus amount may be increased near the in-focus state. However, in such case, in a large defocus state, a sufficiently large change in evaluation value EV_DFD cannot be obtained. Meanwhile, when the frequency band from which the focus detection signals are extracted is set low, a certain degree of change in evaluation value EV_DFD may be obtained in a wider defocus range. Therefore, when the defocus state is to be determined at high accuracy near the in-focus state, the frequency band from which the focus detection signals are extracted may be set high. Meanwhile, when the certain degree of change in evaluation value EV_DFD is to be obtained in a wide defocus range, the frequency band from which the focus detection signals are extracted may be set low.

When not all of the first to third focus detection signals are to be used in the DFD processing (NO in Step S903), the processing proceeds to Step S904. In Step S904, it is determined whether or not the first focus detection signal (image A signal) and the third focus detection signal (image A+B signal) are to be used in the DFD processing. When the first and third focus detection signals are used to perform the DFD processing (YES in Step S904), the processing proceeds to Step S906.

In Step S906, the first focus detection signal (image A) and the third focus detection signal (image A+B) are used to perform the DFD processing. Specifically, the power P1 of the first focus detection signal and the power P3 of the third focus detection signal, which are calculated as described above, are used to calculate the evaluation value EV_DFD for determining the defocus state by the following expression (6), for example.

$$EV\_DFD = (P3/(2 \times P1)) \times 2 \qquad (6)$$

The first focus detection signal and the third focus detection signal are obtained by the light fluxes with significantly different F-numbers, and also the difference in intensity between the first focus detection signal and the third focus detection signal is set appropriately, with the result that the highly reliable evaluation value EV_DFD may be obtained.

The evaluation value EV_DFD obtained by the expression (6) has characteristics similar to the above-mentioned characteristics of the evaluation value EV_DFD obtained by the expression (5). Processing similar to the processing performed in Step S905 is performed in that a threshold is set for the evaluation value EV_DFD, and in that a determination on the in-focus state is performed depending on whether or not the evaluation value EV_DFD exceeds the threshold.

When the second focus detection signal (image B signal) and the third focus detection signal (image A+B signal) are to be used in performing the DFD processing (NO in Step S904), the processing proceeds to Step S907. In Step S907, the second focus detection signal and the third focus detection signal are used to perform the DFD processing. Specifically, the power P2 of the second focus detection signal and the power P3 of the third focus detection signal, which are calculated as described above, are used to calculate the evaluation value EV_DFD for determining the defocus state by the following expression (7), for example.

$$EV\_DFD = (P3/(2 \times P2)) \times 2 \qquad (7)$$

The second focus detection signal and the third focus detection signal are obtained by the light fluxes with significantly different F-numbers, and also the difference in intensity between the second focus detection signal and the third focus detection signal is set appropriately, with the result that the highly reliable evaluation value EV_DFD may be obtained.

The evaluation value EV_DFD obtained by the expression (7) has characteristics similar to the above-mentioned characteristics of the evaluation value EV_DFD obtained by the expression (6). Processing similar to the processing performed in Step S905 and Step S906 is performed in that a threshold is set for the evaluation value EV_DFD, and in that a determination on the in-focus state is performed depending on whether or not the evaluation value EV_DFD exceeds the threshold.

After the DFD processing in any one of Steps S905 to S907 is ended, the processing proceeds to Step S908. In Step S908, it is determined whether or not reliability of the result of the correlation computing between the image A and the image B, which is performed in Step S901, that is, the focus detection result is high. Various methods of determining the reliability may be contemplated, but in this embodiment, at least the determination on whether or not the photographing optical system 133 is near the in-focus state, which is performed by the DFD processing, is used. In the phase-difference focus detection or the like, when the object has a repetitive black and white pattern, a plurality of shift amounts with which the correlation amount COR1(k) takes a minimum value may be detected. In such case, inconsistency occurs between the result of the DFD processing and the result of the phase-difference focus detection or the like. When the inconsistency occurs between the result of the DFD processing and the result of the phase-difference focus detection or the like, it is determined that reliability of the result of the phase-difference focus detection is low. In other words, when the result of the phase-difference focus detection or the like indicates that the photographing optical system 133 is near the in-focus state even though it is determined from the result of the DFD processing that the photographing optical system 133 is not near the in-focus state, it is determined that the reliability of the result of the phase-difference focus detection is low. When no inconsistency occurs between the result of the DFD processing and the result of the phase-difference focus detection or the like, it is determined that the reliability of the result of the phase-difference focus detection or the like is high.

Further, in Step S908, in view of not only the result of the DFD processing but also the degree of matching, contrasts, and the like of the two images used in the focus detection, it is determined whether or not the reliability of the result of the focus detection is high.

When it is determined that the reliability of the result of the focus detection is high (YES in Step S908), the processing proceeds to Step S909, and the defocus amount is calculated. Specifically, the image pickup surface phase-difference focus detection part 129 applies known correlation computing and the like on the first focus detection signal (image A) and the second focus detection signal (image B), that is, the pair of image signals to calculate the image shift amount. Then, the image pickup surface phase-difference focus detection part 129 converts the calculated image shift amount into the defocus amount. In this manner, the defocus amount is calculated.

On the other hand, when it is determined that the reliability of the result of the focus detection is not high (NO in Step S908), the processing proceeds to Step S910, and it is determined that the defocus amount cannot be calculated. In this manner, the processing for calculating the defocus amount is performed.

As described above, according to this embodiment, the defocus state may be detected based on at least one of the first focus detection signal (image A) or the second focus detection signal (image B), and the third focus detection signal (image A+B). The reliability of the result of the phase-difference focus detection or the like may be determined depending on whether or not there is inconsistency between the result of the detection of the thus-detected defocus state and the result of the phase-difference focus detection or the like. The according to this embodiment, the image pickup apparatus capable of performing satisfactory focusing can be provided.

Modified Embodiment

The present invention is not limited to the embodiment described above, and various modifications may be made thereto.

For example, in the embodiment described above, it has been determined whether or not the result of the phase-difference focus detection is reliable using the result of the detection of the defocus state, which has been obtained by the DFD processing, but the present invention is not limited thereto. For example, the reliability of the result of the contrast focus detection or the like may be determined using the result of the detection of the defocus state, which has been obtained by the DFD processing.

Moreover, in the embodiment described above, it has been determined whether or not the result of the focus detection by a method that is different from the DFD focus detection is reliable using the result of the detection of the defocus state, which has been obtained by the DFD focus detection, but the use of the DFD focus detection is not limited thereto. As described above, in the DFD focus detection, the degree of matching of the signals obtained by the light fluxes with the different F-numbers may be detected to determine whether or not the photographing optical system 133 is near the in-focus state. Therefore, it is also possible to notify the photographer of a region near the in-focus state in the photographing range using the result of the DFD processing. For example, a region near the in-focus state in the photographing range may be highlighted for display on the display device 126, which is arranged on the back of the image pickup apparatus 10. Then, the photographer may take an image while checking the in-focus state in a manual focus setting, for example. The display of the in-focus state also means display of the defocus state. In this manner, the result of the DFD processing may be used to display the defocus state.

Moreover, it is also possible to use the result of the DFD processing in setting the focus detection region. In general, when there are a plurality of objects at different distances from the image pickup apparatus 10 in the focus detection region, a near/far conflict occurs, and hence a focus detection error may occur. Therefore, in performing the focus detection, it is desired that objects at substantially equal distances from the image pickup apparatus 10 be located in the focus detection region. As described above, in the DFD focus detection, the defocus state may be determined, and hence the focus detection region may be set. For example, a region in which the evaluation value EV_DFD is within a predetermined range may be set as the focus detection region, and the phase-difference focus detection may be performed on the set focus detection region. In other words, the region as a target of the detection of the defocus amount may be set based on the result of the detection of the defocus state by the defocus state detection unit. In this manner, the generation of the focus detection error due to the near/far conflict may be avoided. The camera MPU 125 may also function a detection target region setting unit configured to set a region as the target of the detection of the defocus amount based on the result of the detection of the defocus state by the defocus state detection unit.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one more of the above-described embodiment (s) and/or controlling the one or more circuits to perform the functions or one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-149656, filed Jul. 29, 2015, which is hereby incorporated by reference herein in its entirety.

What is claimed is:

1. An image pickup apparatus, comprising:
an image pickup element configured to photoelectrically convert an object image, which is generated by a photographing optical system, wherein the image pickup element has a pair of photoelectric converters, each configured to convert a pair of object images formed by light fluxes passing through a pair of exit pupils of a photographing optical system;
at least one processor; and
a memory which is coupled to the at least one processor and storing instructions which cause the at least one processor to perform operations of following units of the image pickup apparatus:
a signal acquisition unit configured to acquire, using the image pickup element, a first signal obtained from a light flux that has passed through a first pupil partial region, which is a part of a pupil region of the photographing optical system, a second signal obtained from a light flux that has passed through a second pupil partial region, which is different from the first pupil partial region, of the pupil region, and a third signal obtained from one of a light flux that has passed through a region that includes the first pupil partial region and is wider than the first pupil partial region, and a light flux that has passed through a region that includes the second pupil partial region and is wider than the second pupil partial region; and
a defocus state detection unit configured to detect a defocus state of the photographing optical system based on at least one of a power of the first signal and a power of the second signal, and a power of the third signal.

2. The image pickup apparatus according to claim 1, wherein the at least one processor is further configured to perform the functions of a signal selection unit configured to select the at least one of the first signal and the second signal based on F-numbers of the light fluxes respectively corresponding to the first signal and the second signal,
wherein the defocus state detection unit is configured to detect the defocus state of the photographing optical system based on the at least one of the power of the first signal and the power of the second signal, which is selected by the power of the signal selection unit, and the third signal.

3. The image pickup apparatus according to claim 1, wherein the at least one processor is further configured to perform the functions of a signal selection unit configured to select the at least one of the first signal and the second signal based on a magnitude relationship between the first signal and the second signal,
wherein the defocus state detection unit is configured to detect the defocus state of the photographing optical system based on the at least one of the power of the first signal and the power of the second signal, which is selected by the signal selection unit, and the power of the third signal.

4. The image pickup apparatus according to claim 1, wherein the at least one processor is further configured to perform the functions of:
a defocus amount detection unit configured to detect a defocus amount of the photographing optical system based on correlation between the first signal and the second signal; and
a reliability determination unit configured to determine reliability of the defocus amount detected by the defocus amount detection unit based on a result of the detection of the defocus state by the defocus state detection unit.

5. The image pickup apparatus according to claim 1, wherein the at least one processor is further configured to perform the functions of:
a defocus amount detection unit configured to detect a defocus amount of the photographing optical system based on correlation between the first signal and the second signal; and
a detection target region setting unit configured to set a region as a target of the detection of the defocus amount based on a result of the detection of the defocus state by the defocus state detection unit.

6. The image pickup apparatus according to claim 1, further comprising a display configured to display the object image,
wherein the display is configured to display the defocus state based on a result of the detection by the defocus state detection unit.

7. The image pickup apparatus according to claim 1, wherein, based on any one of an F-number of the photographing optical system, an S/N ratio of at least one of the first signal, the second signal, and the third signal, or an evaluation band of at least one of the first signal, the second signal, and the third signal, a threshold for the defocus state detection unit to detect whether or not the photographing optical system is in the defocus state is set.

8. The image pickup apparatus according to claim 1, wherein the defocus state detection unit detects the defocus state, based on a magnitude relationship between at least the powers of first and second signals and the power of the third signal.

9. The image pickup apparatus according to claim 1, wherein the power of the first signal is a sum of the first signals, the power of the second signal is a sum of the second signals, and the power of the third signal is a sum of the third signals.

10. The image pickup apparatus according to claim 1, wherein the defocus state detection unit calculates an evaluation value based on a ratio of at least one of the power of the first signal and the power of the second signal to the power of the third signal, and compares the evaluation value with a threshold, to detect the defocus state based on a result of the comparing.

11. A control method for an image pickup apparatus, comprising:
acquiring, using an image pickup element configured to photoelectrically convert an object image, which is generated by a photographing optical system, wherein the image pickup element has a pair of photoelectric converters, each configured to convert a pair of object images formed by light fluxes passing through a pair of exit pupils of a photographing optical system, a first signal obtained from a light flux that has passed through a first pupil partial region, which is a part of a pupil region of the photographing optical system, a second signal obtained from a light flux that has passed through a second pupil partial region, which is different from the first pupil partial region, of the pupil region, and a third signal obtained from one of a light flux that has passed through a region that includes the first pupil partial region and is wider than the first pupil partial region, and a light flux that has passed through a region that includes the second pupil partial region and is wider than the second pupil partial region;

selecting at least one of the first signal and the second signal; and detecting a defocus state of the photographing optical system based on the at least one of a power of the first signal and a power of the second signal, and a power of the third signal.

12. An image pickup apparatus, comprising:
an image pickup element configured to photoelectrically convert an object image, which is generated by a photographing optical system;
at least one processor; and
a memory which is coupled to the at least one processor and storing instructions which cause the at least one processor to perform operations of following units of the image pickup apparatus:
a signal acquisition unit configured to acquire, using the image pickup element, a first signal obtained from a light flux that has passed through a first pupil partial region, which is a part of a pupil region of the photographing optical system, a second signal obtained from a light flux that has passed through a second pupil partial region, which is different from the first pupil partial region, of the pupil region, and a third signal obtained from a light flux that has passed through a region that includes the first pupil partial region and the second pupil partial region; and
a defocus state detection unit configured to detect a defocus state of the photographing optical system by DFD processing based on the first signal and the third signal acquired by the signal acquisition unit,
wherein the at least one processor is further configured to perform the functions of:
a defocus amount detection unit configured to detect a defocus amount of the photographing optical system based on correlation between the first signal and the second signal; and
a reliability determination unit configured to determine reliability of the defocus amount detected by the defocus amount detection unit based on a result of the detection of the defocus state by the defocus state detection unit.

13. An image pickup apparatus, comprising:
an image pickup element configured to photoelectrically convert an object image, which is generated by a photographing optical system;
at least one processor; and
a memory which is coupled to the at least one processor and storing instructions which cause the at least one processor to perform operations of following units of the image pickup apparatus:
a signal acquisition unit configured to acquire, using the image pickup element, a first signal obtained from a light flux that has passed through a first pupil partial region, which is a part of a pupil region of the photographing optical system, a second signal obtained from a light flux that has passed through a second pupil partial region, which is different from the first pupil partial region, of the pupil region, and a third signal obtained from a light flux that has passed through a region that includes the first pupil partial region and the second pupil partial region; and
a defocus state detection unit configured to detect a defocus state of the photographing optical system by DFD processing based on the first signal and the third signal acquired by the signal acquisition unit,
wherein the at least one processor is further configured to perform the functions of:
a defocus amount detection unit configured to detect a defocus amount of the photographing optical system based on correlation between the first signal and the second signal; and
a detection target region setting unit configured to set a region as a target of the detection of the defocus amount based on a result of the detection of the defocus state by the defocus state detection unit.

14. An image pickup apparatus, comprising:
an image pickup element configured to photoelectrically convert an object image, which is generated by a photographing optical system;
at least one processor; and
a memory which is coupled to the at least one processor and storing instructions which cause the at least one processor to perform operations of following units of the image pickup apparatus:
a signal acquisition unit configured to acquire, using the image pickup element, a first signal obtained from a light flux that has passed through a first pupil partial region, which is a part of a pupil region of the photographing optical system, a second signal obtained from a light flux that has passed through a second pupil partial region, which is different from the first pupil partial region, of the pupil region, and a third signal obtained from a light flux that has passed through a region that includes the first pupil partial region and the second pupil partial region; and
a defocus state detection unit configured to detect a defocus state of the photographing optical system by DFD processing based on the first signal and the third signal acquired by the signal acquisition unit,
wherein the DFD processing is a processing to calculate an evaluation value based on a ratio of the power of the first signal to the power of the third signal, and to compare the evaluation value with a threshold, to detect the defocus state based on a result of the comparing.

15. The image pickup apparatus according to claim 14, wherein the at least one processor is further configured to perform the functions of:
a defocus amount detection unit configured to detect a defocus amount of the photographing optical system based on correlation between the first signal and the second signal; and
a reliability determination unit configured to determine reliability of the defocus amount detected by the defocus amount detection unit based on a result of the detection of the defocus state by the defocus state detection unit.

16. The image pickup apparatus according to claim 14, wherein the at least one processor is further configured to perform the functions of:
a defocus amount detection unit configured to detect a defocus amount of the photographing optical system based on correlation between the first signal and the second signal; and a detection target region setting unit configured to set a region as a target of the detection of the defocus amount based on a result of the detection of the defocus state by the defocus state detection unit.

17. The image pickup apparatus according to claim 14, further comprising a display configured to display the object image,
wherein the display is configured to display the defocus state based on a result of the detection by the defocus state detection unit.

18. A control method for an image pickup apparatus, comprising:
acquiring, using an image pickup element configured to photoelectrically convert an object image, which is generated by a photographing optical system, a first signal obtained from a light flux that has passed through a first pupil partial region, which is a part of a pupil region of the photographing optical system, a second signal obtained from a light flux that has passed through a second pupil partial region, which is different from the first pupil partial region, of the pupil region, and a third signal obtained from a light flux that has passed through a region that includes the first pupil partial region and the second pupil partial region;
detecting a defocus state of the photographing optical system by DFD processing based on the first signal and the third signal acquired,
wherein the DFD processing is a processing to calculate an evaluation value based on a ratio of the power of the first signal to the power of the third signal, and to compare the evaluation value with a threshold, to detect the defocus state based on a result of the comparing.

* * * * *